(12) United States Patent
Izuchi et al.

(10) Patent No.: US 7,687,723 B2
(45) Date of Patent: Mar. 30, 2010

(54) MOUNTING SUBSTRATE AND MICROPHONE MOUNTED THEREON

(75) Inventors: Toshiro Izuchi, Fukuoka (JP); Kazuo Ono, Fukuoka (JP); Kensuke Nakanishi, Fukuoka (JP); Hiroaki Onishi, Fukuoka (JP)

(73) Assignee: Hosiden Corporation, Osaka (JP)

( * ) Notice: Subject to any disclaimer, the term of this patent is extended or adjusted under 35 U.S.C. 154(b) by 700 days.

(21) Appl. No.: 11/483,303

(22) Filed: Jul. 6, 2006

(65) Prior Publication Data

US 2007/0010141 A1 Jan. 11, 2007

(30) Foreign Application Priority Data

Jul. 8, 2005 (JP) ............................... 2005-199754

(51) Int. Cl.
*H05K 1/16* (2006.01)

(52) U.S. Cl. ....................... 174/260; 174/261

(58) Field of Classification Search .......... 174/260–261
See application file for complete search history.

(56) References Cited

U.S. PATENT DOCUMENTS 6,239,385 B1 * 5/2001 Schwiebert et al. ......... 174/261
6,787,443 B1 * 9/2004 Boggs et al. ................ 438/612

FOREIGN PATENT DOCUMENTS

| EP | 1 530 401 | 5/2005 |
|----|-----------|--------|
| GB | 2015299 | 9/1979 |
| JP | 52-079872 | 7/1977 |
| JP | 53-147262 | 12/1978 |
| JP | 11-214449 | 8/1999 |
| JP | 2000-189893 | 7/2000 |
| JP | 2003-153392 | 5/2003 |
| JP | 2004-006454 | 1/2004 |
| JP | 2004-303797 | 10/2004 |
| WO | WO 2005/013641 | 2/2005 |

OTHER PUBLICATIONS

Notification of Reason(s) for Refusal for JP patent application No. 2005-199754 issued May 26, 2009.

* cited by examiner

*Primary Examiner*—Jeremy C Norris
(74) *Attorney, Agent, or Firm*—David N. Lathrop

(57) ABSTRACT

To provide a mounting substrate that requires a reduced amount of solder and reduces a thermal effect of solder on the interior of an electronic component, and a microphone to be mounted on the substrate. A mounting substrate according to the present invention includes: a solder part formed on a part of an electrode formed on the mounting substrate; a resist film formed to prevent the solder of the solder part from flowing out of a predetermined range; and a gas-escape groove that is constituted by the absence of the electrode and the resist film and allows gas produced during soldering to escape.

3 Claims, 7 Drawing Sheets

MOUNTING SUBSTRATE AND MICROPHONE MOUNTED THEREON

BACKGROUND OF THE INVENTION

1. Field of the invention

The present invention relates to a mounting substrate on which a component is mounted by soldering, and a microphone mounted thereon.

2. Description of the Related Art

FIG. 1 shows an exemplary configuration of a conventional microphone disclosed in Japanese Patent Application Laid Open No. 2003-153392 (Patent Reference 1). This microphone is an electret condenser microphone that comprises a capsule 1, and a diaphragm ring 3, a diaphragm 4, a spacer 5, a back electrode 6, a holder 7, a gate ring 8, a circuit board 10 and an electric circuit 9 mounted on the circuit board 10, which are stacked in the capsule 1 in this order from a sound aperture 2. An edge of the capsule 1 is caulked onto the circuit board 10, thereby fixing the incorporated components in the capsule 1. Conductor parts (not shown in FIG. 1) are formed on the outer surface of the circuit board 10, and a solder bump electrode 11 to constitute an output terminal and a solder bump electrode 12 to constitute a grounding terminal are formed.

FIG. 2 shows exemplary electrodes of a mounting substrate on which the microphone shown in FIG. 1 is to be mounted. As shown in FIG. 2, on a mounting substrate 13 on which the microphone is to be mounted, a circular solder part 14 corresponding to the solder bump electrode 11 of the microphone and a ring-shaped solder part 15 corresponding to the solder bump electrode 12 are formed.

When mounting the microphone on the mounting substrate 13, the solder bump electrodes 11 and 12 of the microphone are placed on the solder parts 14 and 15 of the mounting substrate 13, respectively. Then, the mounting substrate and the microphone are placed in a reflow oven to make the solder molten, thereby fusing the solder parts 14 and 15 with the solder bump electrodes 11 and 12, respectively.

Here, the solder bump electrodes 11 and 12 of the microphone are formed in the procedure shown in FIG. 3A, FIG. 3B, and FIG. 3C. As shown in FIG. 3A, a circular conductor part 10a corresponding to the output terminal and a ring-shaped conductor part 10a corresponding to the grounding terminal are formed on the outer surface of the circuit board 10 of the microphone. As shown in FIG. 3B, a resist film 10b is formed on the conductor parts 10a excluding the areas on which the solder bump electrodes 11 and 12 are to be formed. As shown in FIG. 3C, the solder bump electrodes 11 and 12 are formed on the areas in which no resist film 10b is formed in such a manner that the solder bump electrodes 11 and 12 protrude beyond a caulked part 1a.

As described above, the reflow oven is used in the process of mounting the microphone on the mounting substrate and achieving soldering. According to the prior art, before soldering, the solder bump electrodes 11 and 12 protruding beyond the caulked part have to be formed on the microphone, and the solder parts 14 and 15 have to be formed on the mounting substrate 13. In this case, the solder has to be applied over a wide area, and an increased amount of solder is required to form such raised solder bumps. Thus, there is a problem that a large amount of solder is required to achieve adequate soldering.

In addition, in the reflow oven, the solder bump electrodes 11 and 12 and the solder parts 14 and 15 are made molten, and the solder flows over a wide area. Thus, the resist film 10b also comes into contact with the molten solder. In this way, a wide area of the circuit board 10 comes into contact with the molten solder, so that the heat is likely to be conducted to the interior of the microphone through the circuit board 10. The heat once conducted to the interior of the microphone causes a stress therein and adversely affects the same. For example, the sensitivity of the electret may be reduced.

BRIEF SUMMARY OF THE INVENTION

An object of the present invention is to provide a mounting substrate that requires a reduced amount of solder and reduces a thermal effect of solder on the interior of an electronic component (a microphone, for example), and a microphone to be mounted on the substrate.

A mounting substrate according to the present invention is a mounting substrate on which a component is mounted by soldering (in particular, a reflow process).

The mounting substrate according to the present invention comprises: a solder part formed on a part of an electrode formed on the mounting substrate; a resist film formed to prevent the solder of the solder part from flowing out of a range required for soldering; and a gas-escape groove that is constituted by the absence of the electrode and the resist film and allows gas produced during soldering to escape. In the case where a component (a microphone, for example) having an electrode (referred to as central terminal hereinafter) and another electrode (referred to as peripheral terminal hereinafter) formed around the central terminal is mounted, each part of the mounting substrate has characteristics described below. That is, the electrode formed on the mounting substrate includes a central electrode part that faces the central terminal, a plurality of outer electrode parts that face part of the peripheral terminal, and a linkage electrode part that interconnects the outer electrode parts. The solder part is formed on each of the central electrode part and the outer electrode parts. The gas-escape groove is configured to allow the gas inside the peripheral terminal to escape to the outside.

In addition, in a microphone according to the present invention, a central terminal and a peripheral terminal formed on an outer surface of a circuit board protrude beyond an outer housing (a capsule and a caulked part of the capsule) of the microphone, and the peripheral terminal is ring-shaped.

According to the present invention, only an area of the electrode formed on the mounting substrate in which the resist film is not formed is covered with solder, and the solder does not flow to the other areas. Therefore, the amount of solder can be reduced. In addition, since the area of the solder is limited, the thermal effect of the solder on the interior of the electronic component can be reduced. Furthermore, gas produced during soldering can escape to the outside without being confined in the gap between the electronic component and the mounting substrate.

DETAILED DESCRIPTION OF THE INVENTION

Figure 1:
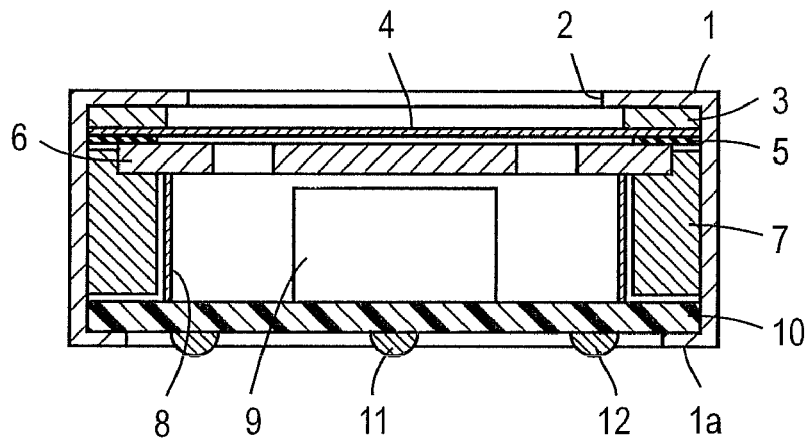
FIG. 1 is a cross-sectional view of a conventional microphone.
Figure 2:
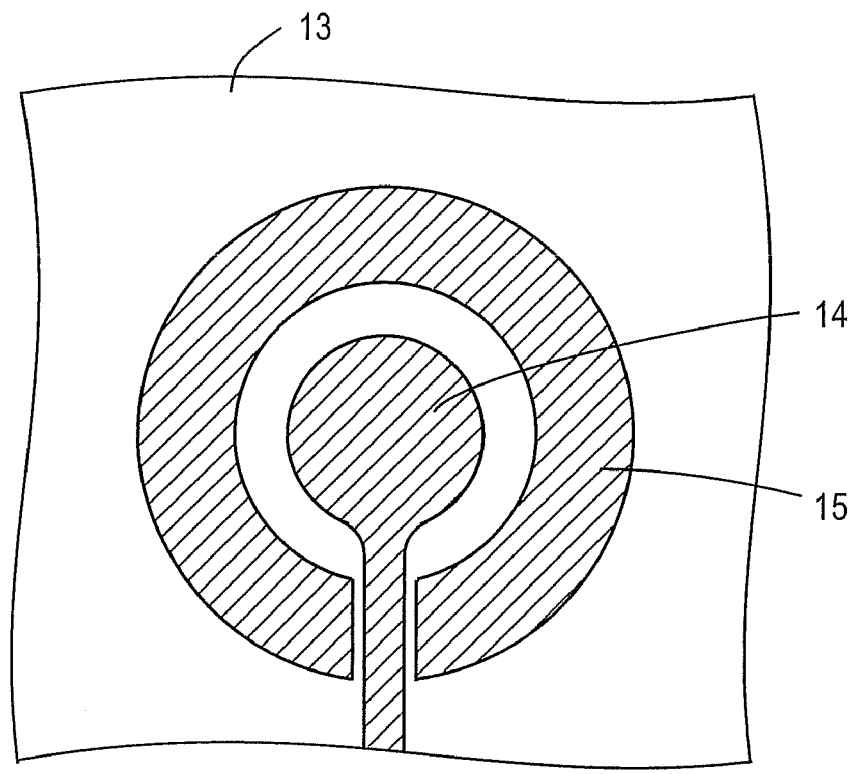
FIG. 2 is a plan view of a conventional mounting substrate.
Figure 3A:
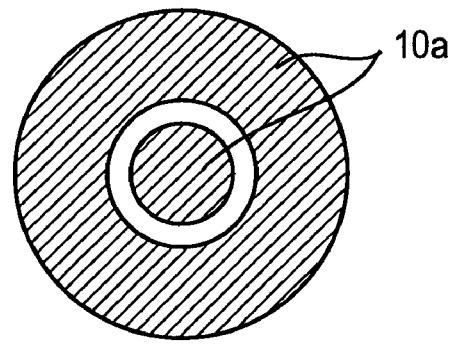
FIG. 3A is a plan view of a circuit board on which conductor parts are formed in a process of forming a central terminal and a peripheral terminal.
Figure 3B:
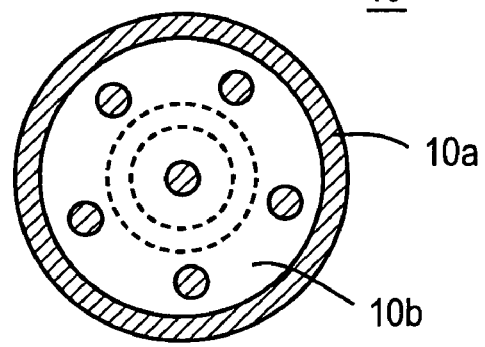
FIG. 3B is a plan view of the circuit board on which a resist film is formed in the process of forming the central terminal and the peripheral terminal.
Figure 3C:
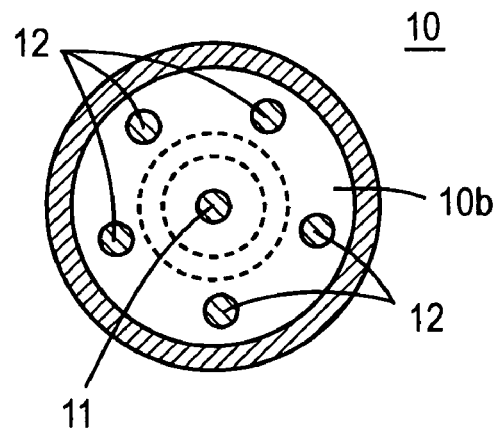
FIG. 3C is a plan view of the circuit board on which solder bump electrodes are formed in the process of forming the central terminal and the peripheral terminal.

In the following, an embodiment of the present invention will be described. The same parts are denoted by the same reference numerals, and redundant descriptions thereof will be omitted.

Embodiment

Figure 4A:
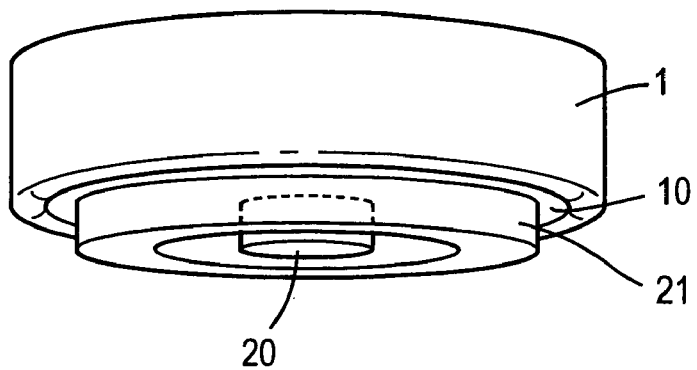
FIG. 4A is a perspective view showing the appearance of a microphone.
Figure 4B:
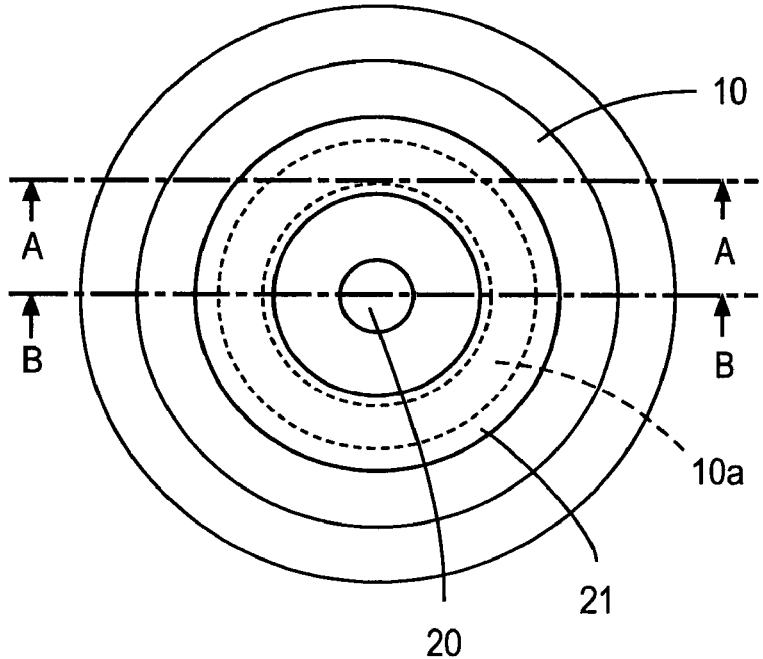
FIG. 4B is a plan view of a circuit board of the microphone.
Figure 4C:
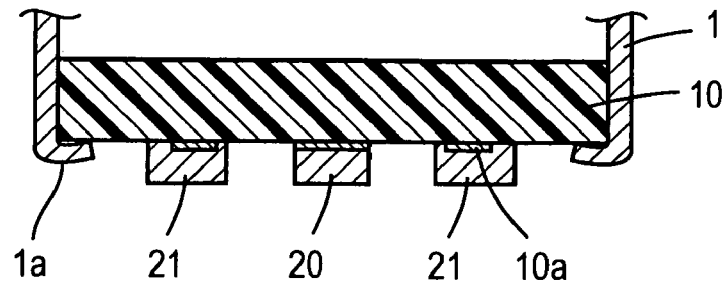
FIG. 4C is a cross-sectional view of the microphone showing a relationship among a central terminal, a peripheral terminal and conductor parts on the circuit board.

FIG. 4A is a perspective view showing the appearance of a microphone, FIG. 4B is a plan view of a circuit board 10 of the microphone, and FIG. 4C is a cross-sectional view of the microphone showing a relationship among a central terminal 20, a peripheral terminal 21 and conductor parts 10*a* on the circuit board 10. The central terminal 20 has a circular shape and is formed on an outer surface of the circuit board 10. The peripheral terminal 21 is ring-shaped and is formed around the central terminal 20. Typically, the central terminal 20 constitutes an output terminal, and the peripheral terminal 21 constitutes a grounding terminal. In addition, the central terminal 20 and the peripheral terminal 21 protrude beyond an outer housing (a capsule 1 and a caulked part 1*a*) of the microphone. Specifically, the central terminal 20 and the peripheral terminal 21 are higher than the caulked part 1*a* at the edge of the capsule 1. For example, if the caulked part 1*a* has a height of 0.1 mm, the central terminal 20 and the peripheral terminal 21 have a height of 0.3 mm. The cross-sectional view of FIG. 4C is taken along the line B-B in FIG. 4B. The central terminal 20 and the peripheral terminal 21 are formed on the conductor parts 10*a* formed on the circuit board 10. For example, the central terminal 20 and the peripheral terminal 21 may be composed of a copper foil covered with an antioxidant film of nickel or gold. Furthermore, the central terminal 20 and the peripheral terminal 21 can be formed simultaneously with the conductor parts 10*a* by changing the plating condition of the conductor parts 10*a*. The conductor parts 10*a* may be formed by trimming a copper foil covering the circuit board 10.

Figure 5A:
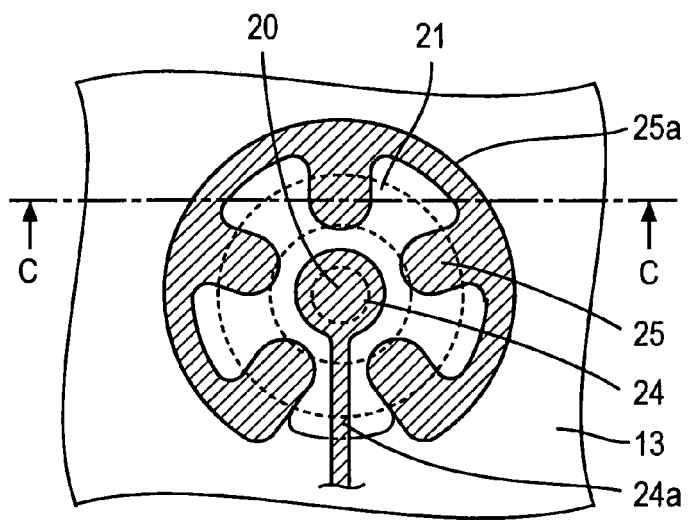
FIG. 5A is a plan view of a mounting substrate on which electrodes are formed.
Figure 5B:
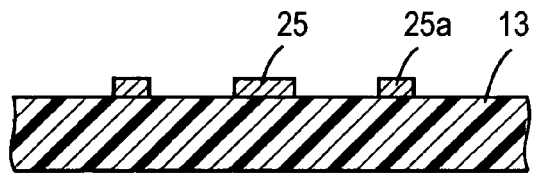
FIG. 5B is a cross-sectional view of the mounting substrate on which the electrodes are formed.

Now, a production method for and an arrangement of the mounting substrate according to the present invention will be described with reference to the drawings. FIG. 5A is a plan view of the mounting substrate 13 on which electrodes are formed. FIG. 5B is a cross-sectional view taken along the line C-C in FIG. 5A. The electrodes are a central electrode part 24 intended to face the central terminal 20 of the microphone, a plurality of outer electrode parts 25 intended to face parts of the peripheral terminal 21 of the microphone, and a linkage electrode part 25*a* that links the outer electrode parts with each other. The central electrode part 24 is surrounded by the outer electrode parts 25 and the linkage electrode part 25*a*. The central electrode part is in communication with the outside via a leading electrode part 24*a*. Instead of the leading electrode part 24*a*, a through hole may be formed in the mounting substrate 13 to bring the central electrode part into communication with the backside of the mounting substrate 13.

Figure 6A:
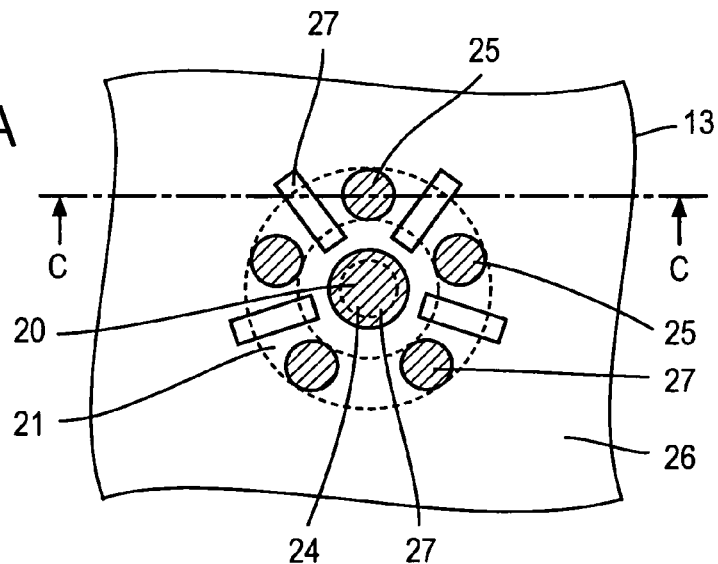
FIG. 6A is a plan view of the mounting substrate on which a resist film is formed.
Figure 6B:
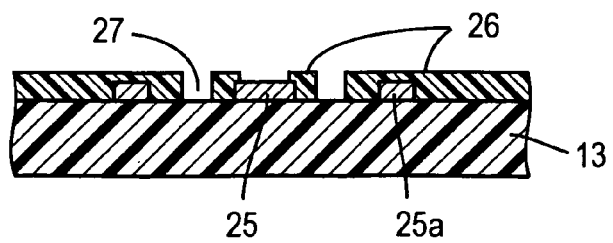
FIG. 6B is a cross-sectional view of the mounting substrate on which the resist film is formed.

FIG. 6A is a plan view of the mounting substrate 13 on which a resist film 26 is formed. FIG. 6B is a cross-sectional view taken along the line C-C in FIG. 6A. On the central electrode part 24 and the outer electrode parts 25, there are formed areas in which the resist film is not formed (referred to as resist-film-free area 27). In addition, resist-film-free areas 27 are also formed between the outer electrode parts so that the resist-film-free areas 27 interconnect the areas on the inner and outer sides of the peripheral terminal 21 of the microphone. In this way, the resist-film-free areas 27 are formed at the positions of the electrodes on the mounting substrate 13 and at positions where no electrode is formed. The resist-film-free areas 27 formed at the positions of the electrodes are intended for soldering of the electrodes to the microphone (or other component to be mounted on the mounting substrate 13). The resist-film-free areas 27 formed at positions where no electrode is formed are intended for formation of grooves for the escape of gas produced during soldering.

Figure 7A:
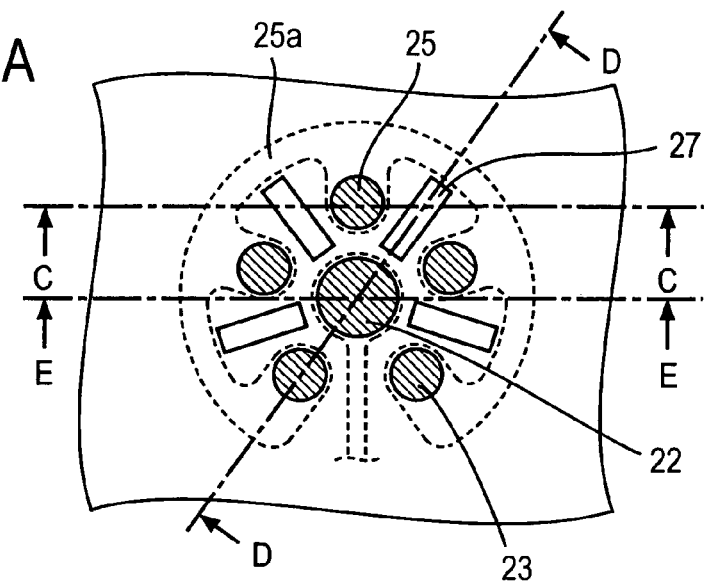
FIG. 7A is a plan view of the mounting substrate on which solder parts are formed.
Figure 7B:
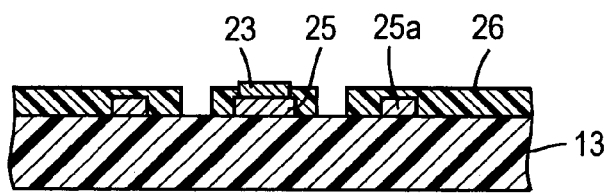
FIG. 7B is a cross-sectional view of the mounting substrate on which the solder parts are formed.
Figure 7C:
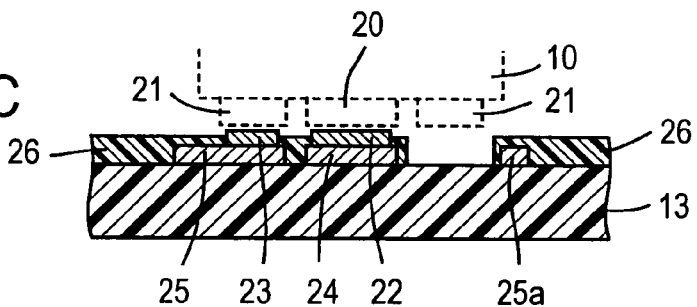
FIG. 7C is another cross-sectional view of the mounting substrate on which the solder parts are formed.
Figure 7D:
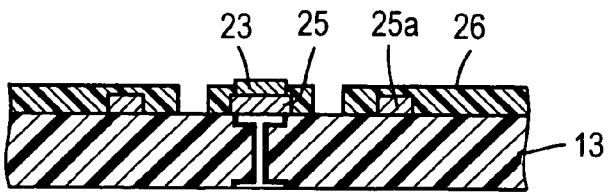
FIG. 7D is a cross-sectional view of a mounting substrate having a through hole on which solder parts are formed.

FIG. 7A is a plan view of the mounting substrate 13 on which solder parts 22 and 23 are formed. FIG. 7B is a cross-sectional view taken along the line C-C in FIG. 7A. FIG. 7C is a cross-sectional view taken along the line D-D in FIG. 7A. The solder parts 22 and 23 are formed on the central electrode parts 24 and the outer electrode parts 25, which are not covered with the resists film 26. As shown in FIG. 7C, the resist-film-free areas 27 at positions where no electrode is formed constitute grooves that interconnect the areas on the inner side (that is, the side closer to the central terminal) and on the outer side of the peripheral terminal 21 of the microphone. The grooves are gas-escape grooves that allow gas produced on the inner side of the peripheral terminal 21 of the microphone (that is, the side closer to the central terminal) to escape during soldering. FIG. 7D is a cross-sectional view taken along the line C-C in FIG. 7A, which shows an arrangement in which a through hole is formed to bring an outer electrode part 25 into communication with the backside of the mounting substrate 13.

Figure 8:
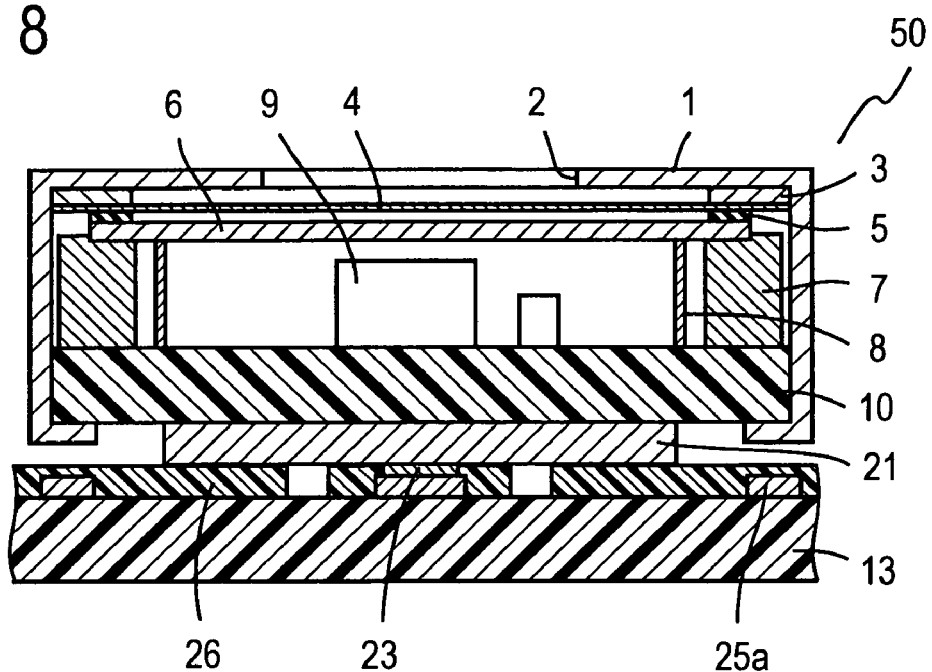
FIG. 8 is a cross-sectional view showing an embodiment of the present invention.
Figure 9:
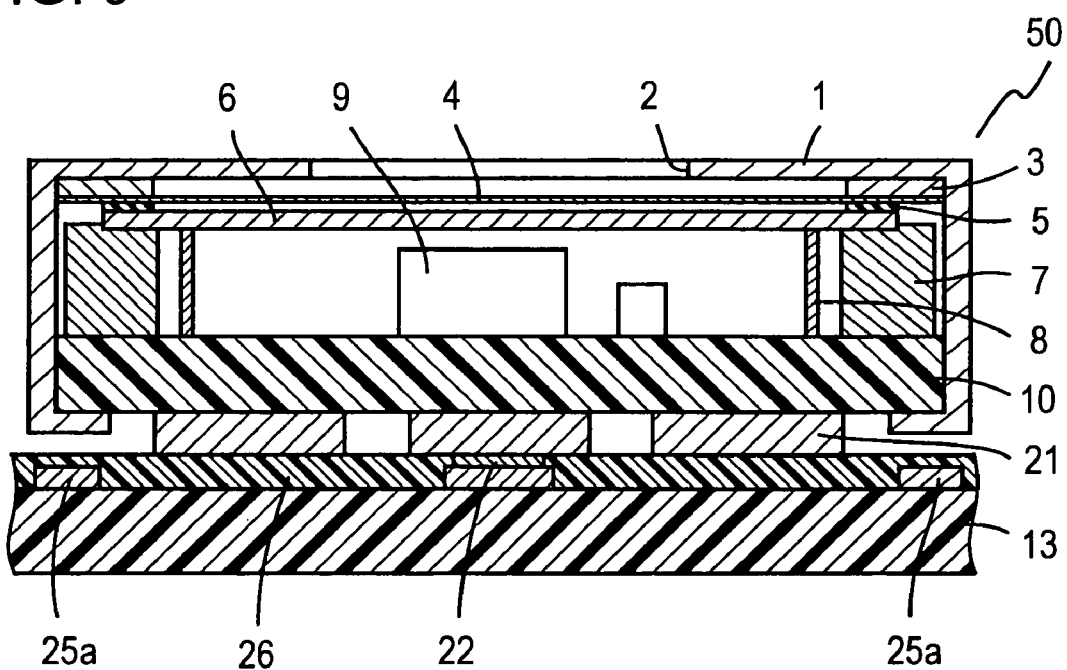
FIG. 9 is another cross-sectional view showing the embodiment of the present invention.

FIGS. 8 and 9 are cross-sectional views of the microphone mounted on the mounting substrate according to the present invention. The cross-sectional view of FIG. 8 is taken along the line C-C in FIG. 7A (which shows the mounting substrate) and the line A-A in FIG. 4B (which shows the microphone), and the cross-sectional view of FIG. 9 is taken along the line E-E in FIG. 7A (which shows the mounting substrate) and the line B-B in FIG. 4B (which shows the microphone). The circuit board 10 is housed in the capsule 1, and an edge of the capsule 1 is caulked to secure the circuit board 10 together with other incorporated components. Even if the solder is made molten in a reflow oven, the solder of the solder parts 23 on the outer electrode parts 25 is confined by the resist film 26 and thus does not flow to the outside of the outer electrode parts 25. In addition, the solder of the solder part 22 on the central electrode part 24 is also confined by the resist film 26 and thus does not flow to the outside of the central electrode part 24. Since the flow of the solder is limited in this way, heat conduction to the microphone can be reduced.

Figure 10:
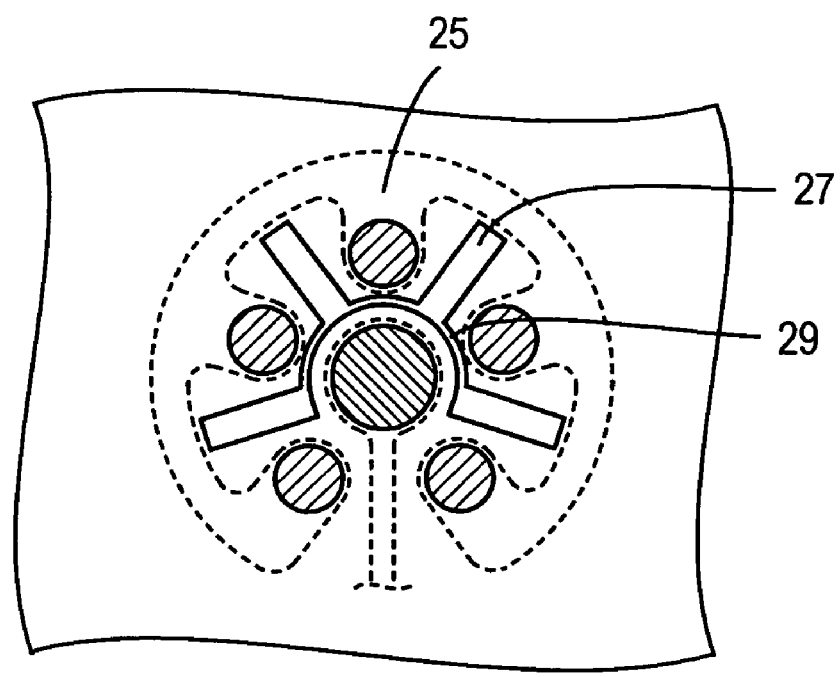
FIG. 10 is a plan view showing another example of the resist film formed on the mounting substrate.

In the example shown in FIG. 7A, most area of the mounting substrate 13 is covered with the resist film. However, the resist film 26 can be formed arbitrarily as far as the resist film 26 prevents the solder from flowing to the outside of the central electrode part 24 and the outer electrode parts 25. For example, a resist-film-free area 29 may be formed that constitutes an integral gas-escape groove as shown in FIG. 10. Alternatively, a resist-film-free area may be formed on the outer side of the outer electrode parts 25. Furthermore, the resist film 26 may be formed only along the outer peripheries of the central electrode part 24 and the outer electrode parts 25 and on the linkage electrode part 25a and the leading electrode part 24a.

In the embodiment described above, the component to be mounted on the mounting substrate 13 is a microphone. However, the mounting substrate according to the present invention can be used for any other components with the same advantages.

The invention claimed is:

1. A mounting substrate on which a component is mounted by soldering, the component having a central terminal and a peripheral terminal formed around the central terminal, the mounting substrate comprising:
    a central electrode part that faces the central terminal;
    a plurality of outer electrode parts that face part of the peripheral terminal, wherein there are spaces between the outer electrode parts;
    a linkage electrode part formed on the mounting substrate outside the peripheral terminal that interconnects the outer electrode parts;
    a solder part formed on each of the central electrode part and the outer electrode parts;
    a resist film formed to prevent the solder of said solder part from flowing out of a predetermined range; and
    a gas-escape groove that is constituted by the absence of said central electrode part, the outer electrode parts and said resist film, is surrounded with walls of said resist film, and formed at least between a pair of outer electrode parts to interconnect areas on inner and outer sides of the peripheral terminal.

2. The mounting substrate according to claim 1, wherein a plurality of said gas-escape grooves are formed, and each gas-escape groove is connected to the other gas-escape grooves by the absence of said resist film on the inner side of said peripheral terminal.

3. A microphone mounted on a mounting substrate according to claim 1 or 2,
    wherein the microphone has an electrode (referred to as central terminal hereinafter) and another electrode (referred to as peripheral terminal hereinafter) formed around the central terminal, and
    said central terminal and said peripheral terminal protrude beyond an outer housing of the microphone, and said peripheral terminal is ring-shaped.

* * * * *